US012089468B2

(12) United States Patent
Kim et al.

(10) Patent No.: US 12,089,468 B2
(45) Date of Patent: Sep. 10, 2024

(54) DISPLAY APPARATUS

(71) Applicant: Samsung Display Co., Ltd., Yongin-si (KR)

(72) Inventors: Soodong Kim, Yongin-si (KR); Youngsoo Kwon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 411 days.

(21) Appl. No.: 17/578,018

(22) Filed: Jan. 18, 2022

(65) Prior Publication Data

US 2022/0320182 A1    Oct. 6, 2022

(30) Foreign Application Priority Data

Apr. 2, 2021   (KR) .................. 10-2021-0043501

(51) Int. Cl.
| | | |
|---|---|---|
| *H10K 59/38* | (2023.01) | |
| *C09D 11/30* | (2014.01) | |
| *C09D 11/52* | (2014.01) | |
| *H10K 50/854* | (2023.01) | |
| *H10K 71/00* | (2023.01) | |

(52) U.S. Cl.
CPC ............. *H10K 59/38* (2023.02); *C09D 11/30* (2013.01); *C09D 11/52* (2013.01); *H10K 50/854* (2023.02); *H10K 71/00* (2023.02)

(58) Field of Classification Search
CPC ...... H10K 59/38; H10K 50/854; H10K 71/00; H10K 50/865; H10K 50/85; H10K 59/12; H10K 59/122; H10K 71/135; H10K 50/115; C09D 11/30; C09D 11/52; C09D 11/36; C09D 11/40; C09D 11/50; C09D 11/322; C09D 11/06; C09D 11/08; B82Y 20/00

See application file for complete search history.

(56) References Cited

U.S. PATENT DOCUMENTS

| | | | |
|---|---|---|---|
| 7,994,712 B2 * | 8/2011 | Sung ................... | H10K 59/351 313/511 |
| 10,185,066 B2 | 1/2019 | Chae et al. | |

(Continued)

FOREIGN PATENT DOCUMENTS

| | | | |
|---|---|---|---|
| JP | 2013-254093 A | 12/2013 | |
| JP | 5716805 B2 | 5/2015 | |

(Continued)

OTHER PUBLICATIONS

Photal Otsuka Electronics, "Quantum Efficiency Measurement System," QE-2000 Brochure, May 17, 2013, 6 Page Brochure, 4 Page PDF, Otsuka Electronics Co., Ltd., Osaka, Japan. URL: https://www.pro-lite.co.uk/File/QE-2000_en_130711.pdf.

*Primary Examiner* — Victor A Mandala
(74) *Attorney, Agent, or Firm* — Lewis Roca Rothgerber Christie LLP

(57) ABSTRACT

A display apparatus is provided to include: a first substrate on which a light-emitting device emitting light is located; and a main pixel including a first quantum dot layer; a sub-pixel including a second quantum dot layer, the main pixel and the sub-pixel corresponding to the light-emitting device and being located above the first substrate, wherein the main pixel and the sub-pixel are defined by banks, the main pixel changes a color of the light emitted by the light-emitting device, and the sub-pixel transmits the light emitted by the light-emitting device.

20 Claims, 10 Drawing Sheets

(56) References Cited

U.S. PATENT DOCUMENTS

| | | | |
|---|---|---|---|
| 10,439,167 B2 | 10/2019 | Jo | |
| 10,976,592 B2 | 4/2021 | Kim et al. | |
| 2009/0261715 A1* | 10/2009 | Sung | H10K 50/852 |
| | | | 313/504 |
| 2014/0319502 A1 | 10/2014 | Umemoto | |
| 2017/0012026 A1* | 1/2017 | Choi | H01L 33/62 |
| 2020/0312916 A1 | 10/2020 | Kim et al. | |
| 2021/0202630 A1* | 7/2021 | Jeon | H10K 59/18 |

FOREIGN PATENT DOCUMENTS

| | | |
|---|---|---|
| KR | 10-2009-0111634 A | 10/2009 |
| KR | 10-2012-0098173 A | 9/2012 |
| KR | 10-2016-0015815 A | 2/2016 |
| KR | 10-1747268 B1 | 6/2017 |
| KR | 10-2018-0018945 A | 2/2018 |
| KR | 10-2019-0050886 A | 5/2019 |
| KR | 10-2020-0115761 A | 10/2020 |
| KR | 10-2020-0135727 A | 12/2020 |

\* cited by examiner

DISPLAY APPARATUS

CROSS-REFERENCE TO RELATED APPLICATION

This application claims priority to and the benefit of Korean Patent Application No. 10-2021-0043501, filed on Apr. 2, 2021, in the Korean Intellectual Property Office, the disclosure of which is incorporated herein by reference in its entirety.

BACKGROUND

1. Field

One or more embodiments relate to a display apparatus, and in particular, to a display apparatus including a quantum dot layer.

2. Description of the Related Art

Display apparatuses such as organic light-emitting display apparatuses realize an image by generating light, based on the principle that holes and electrons injected from an anode and a cathode recombine in an emission layer to emit light. For example, the display apparatuses may include pixels emitting light with a color selected from among red, green, and blue, and express (e.g., produce) a desired color by a color combination thereof.

To this end, each of the pixels includes a light-emitting device to generate a single-colored light such as white light or blue light, and a quantum dot layer and/or a color filter as a light control layer to convert the single-colored light into a desired color selected from among red, green, and blue, and then output (e.g., emit to the outside) the light. That is, when the light-emitting device of each pixel generates a single-colored light, the single-colored light passes through the quantum dot layer and/or the color filter to be converted into a color selected from among red, green, and blue and then is output (e.g., emitted to the outside), and an image of a desired color is realized by a combination of colors from these pixels in which light is output with an appropriate color.

SUMMARY

Aspects according to one or more embodiments are directed toward a display apparatus including a main pixel including a quantum dot layer in which quantum dots are concentrated and a sub-pixel suitable (e.g., optimized) for light transmission.

Additional aspects will be set forth in part in the description, which follows and, in part, will be apparent from the description, or may be learned by practice of the presented embodiments of the disclosure.

According to an embodiment, a display apparatus includes
a first substrate, a light-emitting device to emit light and on the first substrate,
a main pixel including a first quantum dot layer,
a sub-pixel including a second quantum dot layer, the main pixel and the sub-pixel corresponding to the light-emitting device and being located above the first substrate, and
banks around the main pixel to define the main pixel and around the sub-pixel to define the sub-pixel,
the main pixel is to change a color of the light emitted by the light-emitting device, and
the sub-pixel is to transmit the light emitted by the light-emitting device.

Inner sides of the banks defining the main pixel and/or the sub-pixel may be coated with scatterers and quantum dots.

The first quantum dot layer may include a layer in which after a first inkjet composition, including a first liquid component and a first solid component, is sprayed, the first liquid component is evaporated such that the first solid component is concentrated, The second quantum dot layer may include a layer in which after a second inkjet composition, including a second liquid component and a second solid component, is sprayed, the second liquid component is not evaporated.

The first solid component and the second solid component may be the same component.

The first liquid component may include a first monomer, and a vapor pressure of the first monomer may be 0.1 mmHg or more.

The second liquid component may include a second monomer, and the vapor pressure of the second monomer may be $10^{-3}$ mmHg or less.

The first solid component may include a scatterer and a quantum dot, wherein the scatterer may be from greater than 0 wt % to about 10 wt % in amount, and the quantum dot may be from about 5 wt % to about 60 wt % in amount, each based on a total weight of the first inkjet composition.

The second solid component may include a scatterer and/or a quantum dot, and the second solid component may be from about 0.1 wt % to less than 60 wt % in amount based on a total weight of the second inkjet composition.

The first inkjet composition and the second inkjet composition may each independently further include a solvent, a light-emitting organic material, a dispersant, a curing agent, or any combination thereof.

The solvent may include propylene glycol methyl ether acetate (PGMEA), dimethylacetamide (DMA), γ-butyrolactone (GBL), cyclohexylamine (CHA), dipropyleneglycol monomethyl ether acetate (DPMA), or any combination thereof.

The light-emitting organic material may include Stilbene 3, Coumarin 120, Coumarin 1, Coumarin 6, Coumarin 47, Coumarin 102, Coumarin 307, Coumarin 153, Rhodamin 6G, Sulforhodamin B, Pyromethene 597, Rhodamin B, Rodamin B/101, Rhodamin 101, DCM, Pyridin 1, Pyridin 2, Styryl 8, Styryl 9, or any combination thereof.

The first solid component and the second solid component may each independently include a scatterer, the scatterer including a metal, a metal oxide, a non-metal oxide, or any combination thereof.

The scatterer may include Ag, Al, $SiO_2$, $BaSO_4$, $Al_2O_3$, ZnO, $ZrO_2$, $TiO_2$, or any combination thereof.

The first solid component and the second solid component may each independently include a quantum dot including a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

The Group III-VI semiconductor compound may include $In_2S_3$, AgInS, $AgInS_2$, CuInS, $CuInS_2$, or any combination thereof,
the Group II-VI semiconductor compound may include CdS, CdSe, CdTe, ZnS, ZnSe, ZnTe, ZnO, HgS, HgSe, HgTe, MgSe, MgS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, CdZnSeS, CdZnSeTe, CdZnSTe, CdHgSeS, CdHgSeTe, CdHgSTe, HgZnSeS, HgZnSeTe, HgZnSTe, or any combination thereof, the Group III-V semiconductor compound may include GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, InGaZnP, InAlZnP, or any combination thereof, the Group III-VI semiconductor compound may include GaS, GaSe, $Ga_2Se_3$, GaTe, InS, InSe, $In_2S_3$, $In_2Se_3$, InTe, $InGaS_3$, $InGaSe_3$, or any combination thereof, the Group I-III-VI semiconductor compound may include AgInS, $AgInS_2$, CuInS, $CuInS_2$, $CuGaO_2$, $AgGaO_2$, $AgAlO_2$, or any combination thereof, the Group IV-VI semiconductor compound may include SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, or any combination thereof, and the Group IV element or compound may include Si, Ge, SiC, SiGe, or any combination thereof.

The light-emitting device may be to emit blue light, green light, red light, or any combination thereof.

The light-emitting device may be to emit blue light and green light, the main pixel may be to change the blue light generated by the light-emitting device into green light, and the sub-pixel may be to transmit the green light generated by the light-emitting device.

The banks may not include a scatterer.

The main pixel and the sub-pixel may each further include a color filter layer.

The color filter layer may be to increase color purity of emitted light.

These and/or other aspects will become apparent and more readily appreciated from the following description of the embodiments, the claims, and the accompanying drawings.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
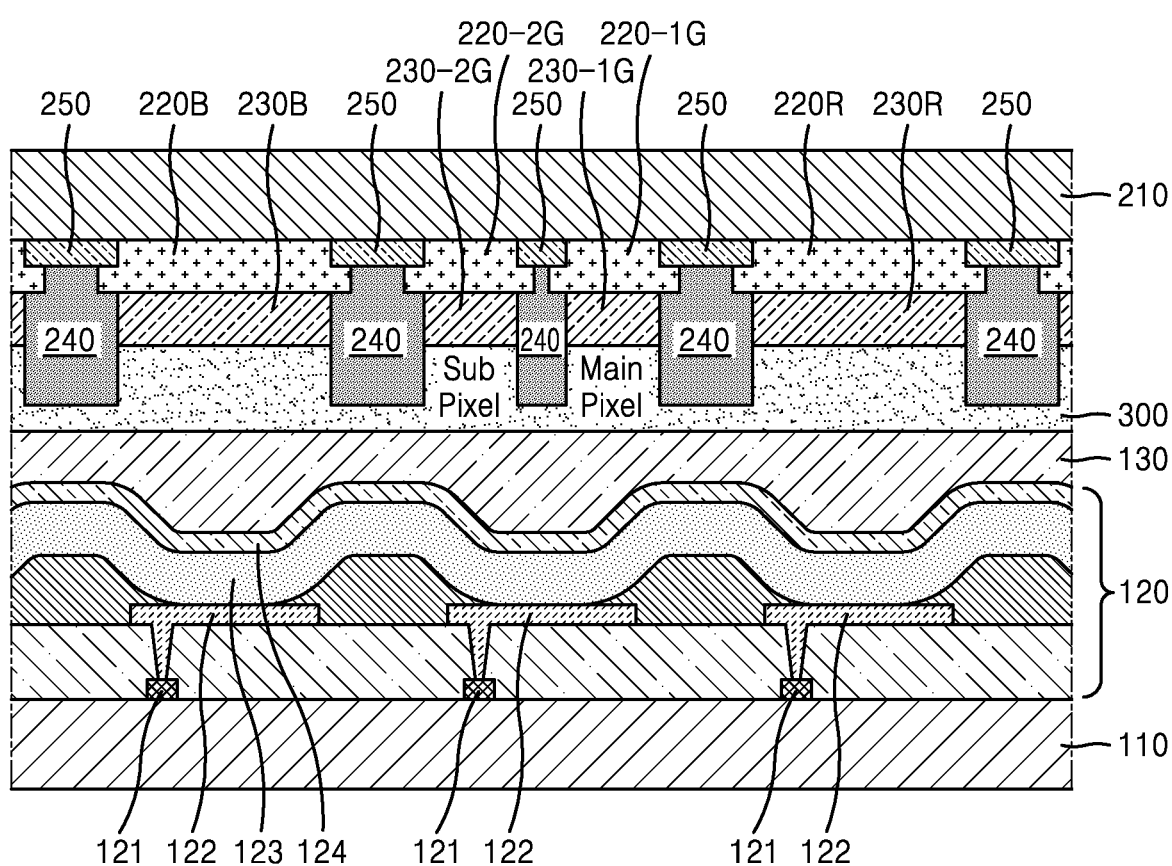
FIG. 1 is a cross-sectional view of a display apparatus according to an embodiment.

Reference will now be made in more detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

Hereinafter, embodiments of the present disclosure will be described in more detail with reference to the accompanying drawings. The same or corresponding components will be denoted by the same reference numerals, and thus redundant description thereof will be omitted.

It will be understood that although the terms "first," "second," etc. may be used herein to describe various components, these components should not be limited by these terms. These terms are only used to distinguish one component from another.

An expression used in the singular encompasses the expression of the plural, unless it has a clearly different meaning in the context.

It will be further understood that the terms "comprises" and/or "comprising" as used herein specify the presence of stated features or elements, but do not preclude the presence or addition of one or more other features or elements.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment is implemented differently, a specific process order may be performed differently from the described order. For example, two processes described in succession may be performed substantially simultaneously, or may be performed in an order opposite to the described order.

It will be understood that when a layer, region, or component is referred to as being "connected to" another layer, region, or component, the layer, region, or component may be directly connected to the other layer, region, or component, or indirectly connected to the other layer, region, or component as intervening layer, region, or component is present. For example, it will be understood that when a layer, region, or component is referred to as being "electrically connected to" another layer, region, or component, the layer, region, or component may be directly electrically connected to the other layer, region, or component, or indirectly electrically connected to the other layer, region, or component as interventing layer, region, or component is present.

According to an embodiment of the present disclosure, a display apparatus may include: a first substrate on which a light-emitting device to emit (e.g., emitting) light is located; a main pixel including a first quantum dot layer; and a sub-pixel including a second quantum dot layer, the main pixel and the sub-pixel corresponding to the light-emitting device and being located above the first substrate, wherein the main pixel and the sub-pixel may be defined by banks, and the main pixel may change a color of the light emitted by the light-emitting device, and the sub-pixel may transmit the light emitted by the light-emitting device.

In some embodiments, each of the main pixel and the sub-pixel may change the color of the light emitted by the light-emitting device or transmit the light emitted from the light-emitting device.

The expression "a main pixel changes a color of light emitted by a light-emitting device" does not mean that the main pixel changes the color of all of the light emitted by the light-emitting device. Although most of the light emitted by the light-emitting device undergoes a color change at the main pixel, some may be transmitted.

The expression "a sub-pixel transmits light emitted by a light-emitting device" does not mean that the sub-pixel transmits all of the light emitted by the light-emitting device. Although most of the light emitted by the light-emitting device is transmitted at the sub-pixel, some may undergo a color change.

Accordingly, for example, the main pixel may change the color of the light emitted by the light-emitting device better (e.g., more) than the sub-pixel, and the sub-pixel may transmit the light emitted by the light-emitting device better (e.g., more) than the main pixel.

In an embodiment, the main pixel may change the color of about 2% to about 99.9% of the light emitted by the light-emitting device, and the sub-pixel may transmit about 2% to about 99.9% of the light emitted by the light-emitting device.

FIG. 1 is a cross-sectional view of a display apparatus according to an embodiment. Here, although only one set of three-color pixels of red, green, and blue is shown, a plurality of sets of such three-color pixels may be distributed in an actual product.

FIG. 1 shows that a blue pixel and a red pixel each include (e.g., consist of) one pixel, and a green pixel includes (e.g., consists of) two pixels (e.g., a main pixel and a sub-pixel).

In one or more embodiments, the green pixel and the red pixel may each include (e.g., consist of) one pixel, and the blue pixel may include (e.g., consist of) two pixels (e.g., a main pixel and a sub-pixel).

In one or more embodiments, the green pixel and the blue pixel may each include (e.g., consist of) one pixel, and the red pixel may include (e.g., consist of) two pixels (e.g., a main pixel and a sub-pixel).

In one or more embodiments, the blue pixel may include (e.g., consist of) one pixel, and the green pixel and the red pixel may each include (e.g., consist of) two pixels (e.g., a main pixel and a sub-pixel).

In one or more embodiments, the red pixel may include (e.g., consist of) one pixel, and the green pixel and the blue pixel may each include (e.g., consist of) two pixels (e.g., a main pixel and a sub-pixel).

In one or more embodiments, the green pixel may include (e.g., consist of) one pixel, and the red pixel and the blue pixel may each include (e.g., consist of) two pixels (e.g., a main pixel and a sub-pixel).

In one or more embodiments, each of the red pixel, the green pixel, and the blue pixel may include (e.g., consist of) two pixels (e.g., a main pixel and a sub-pixel).

As shown in FIG. 1, the display apparatus of the embodiment has a structure in which a first substrate 110, on which a light-emitting device 120 is located, and a second substrate 210, on which quantum dot layers 230R, 230-1G, 230-2G, and 230B and color filter layers 220R, 220-1G, 220-2G, and 220B are located as light controllers (e.g., color control layers), are bonded together with a filling material 300 located therebetween.

In one or more embodiments, the light controllers, that is, the quantum dot layers 230R, 230-1G, 230-2G, and 230B and the color filter layers 220R, 220-1G, 220-2G, and 220B, may be directly stacked on the light-emitting device 120. In an embodiment, after the light controllers are directly stacked on the light-emitting device 120 located on the first substrate 110, a display apparatus may be manufactured by bonding the first substrate 110 and the second substrate 210. In this case, a bank is present between the light controllers.

In one or more embodiments, after the light controllers, that is, the quantum dot layers 230R, 230-1G, 230-2G, and 230B and the color filter layers 220R, 220-1G, 220-2G, and 220B, are directly stacked on the light-emitting device 120 located on the first substrate 110, a display apparatus may be manufactured without a second substrate.

First, the light-emitting device 120 has a structure in which an interlayer 123 including an emission layer is located between a first electrode 122 and a second electrode 124, wherein light is generated based on the principle that holes and electrons injected from the first electrode 122 and the second electrode 124 recombine in the emission layer in the interlayer 123 to emit light. In this regard, the generated light may include blue light, green light, red light, or any combination thereof.

The light-emitting device 120 generates light including blue light, green light, red light, or any combination thereof, and the light controllers of each pixel convert the light into red light, green light, or blue light. The light-emitting device 120 will be described in more detail later.

A reference numeral 121 indicates a pixel circuit connected to the first electrode 122, and includes elements such as a thin-film transistor and a capacitor. Also, a reference numeral 130 indicates a thin-film encapsulation layer that protects the light-emitting device 120 by covering the same, and may be a single-layered film of an organic film or an inorganic film, or may be a multi-layered film in which an organic film and an inorganic film are alternately stacked. The inorganic film may include silicon oxide, silicon nitride, and/or silicon oxynitride, and the organic film may include polyethylene terephthalate, polyethylene naphthalate, polycarbonate, polyimide, polyethylene sulfonate, polyoxymethylene, polyarylate, hexamethyldisiloxane, acryl-based resin (e.g., polymethylmethacrylate and/or polyacrylic acid), or any combination thereof.

The light controllers may include a quantum dot layer, a color filter layer, or any combination thereof.

As the light controllers, the quantum dot layers 230R, 230-1G, 230-2G, and 230B and the color filter layers 220R, 220-1G, 220-2G, and 220B may be provided.

The quantum dot layers 230R, 230-1G, 230-2G, and 230B convert light generated by the light-emitting device 120 into a desired color selected from among red, green, and blue.

The color filter layers 220R, 220-1G, 220-2G, and 220B increase color purity by filtering mixed light that may be partially mixed in the converted color. That is, the color filter layers 220R, 220-1G, 220-2G, and 220B may filter light converted by the quantum dot layers 230R, 230-1G, 230-2G, and 230B respectively to increase color purity.

In some embodiments, a color of light generated by the light-emitting device 120 does not need to be changed, and the light only needs to pass through intactly.

In an embodiment, the red pixel and the green pixel may include both the quantum dot layers 230R and 230G respectively and the color filter layers 220R and 220G respectively, and the blue pixel may only include a white color filter layer 220W (e.g., without the quantum dot layer 230B or the color filter layers 220B). In this case, the light generated by the light-emitting device 120 may be blue light. That is, because a color of light does not need to be changed in the blue pixel, and the light only needs to pass therethrough intactly, the blue pixel may include only the white color filter layer 220W for filtering mixed light. The same may be applied to other cases.

A reference numeral 250 may indicate a black matrix located between each pixel (e.g., between two adjacent pixels) for blocking light, and a reference numeral 240 may indicate a bank defining a boundary between the light controllers of each pixel.

In an embodiment, the reference numeral 250 may be formed with a blue color filter, a red color filter, and/or a green color filter.

In an embodiment, the bank 240 and the black matrix 250 may be formed integrally (e.g., formed as one piece without an interface therebetween).

The bank 240 and the black matrix 250 may include a black pigment, and the black pigment may be dispersed in the entire bank 240 and black matrix 250. The bank 240 may not include a scatterer.

In some embodiments, in forming the bank 240, a bank composition is applied on a substrate and cured, and then undergoes a photolithography process. A more detailed process thereof will be described later.

The bank composition may include a curable polymer, a photoresist compound, a fluorine-containing polymer, a black pigment, a scattering agent, and a solvent, wherein, when the bank composition is cured, the solvent evaporates (e.g., completely).

A light in the visible light region generated from a light source (e.g., a light-emitting device, an organic light-emitting device) is converted into a color selected from among red, green, and blue while passing through the quantum dot layers and the color filter layers, and then is output (e.g., emitted to the outside).

The bank 240 prevents or reduces color mixing of light.

The display apparatus according to an embodiment may include at least one pixel including a main pixel and a sub-pixel.

Figure 2:
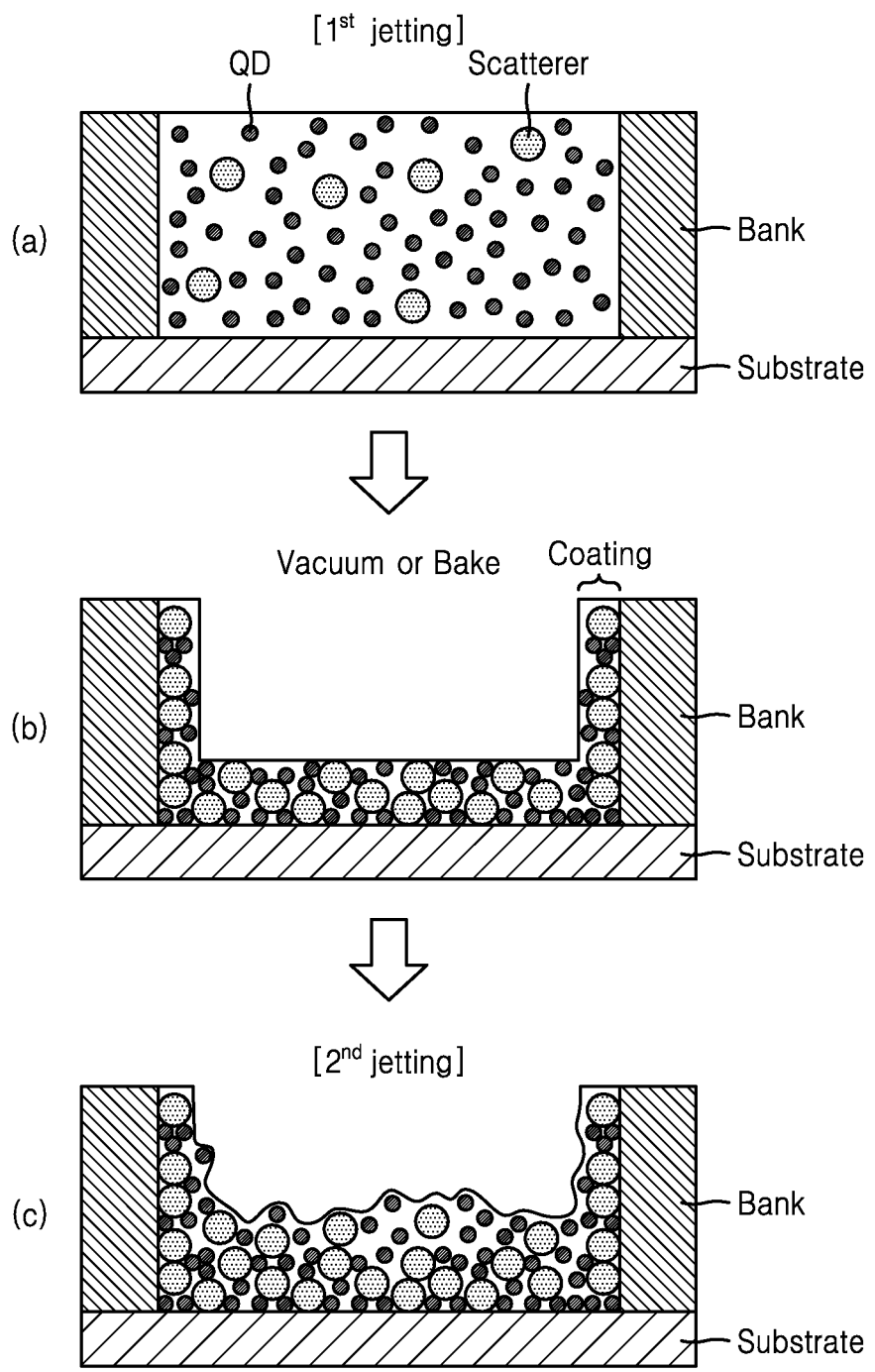
FIG. 2 is a diagram schematically illustrating a process of forming a quantum dot layer in a pixel (for example (e.g.,), a main pixel) of a display apparatus according to an embodiment.

FIG. 2 is a diagram schematically illustrating a process of forming a quantum dot layer in a pixel (e.g., a main pixel) of a display apparatus according to an embodiment.

In an embodiment, inner sides of banks defining the main pixel and/or the sub-pixel may be coated with scatterers and quantum dots.

Referring to FIG. 2, a first jetting is performed on inner surfaces of the banks defining the pixel utilizing an inkjet composition (e.g., a first inkjet composition) including scatterers and quantum dots (a), and then, a volatile component (e.g., a monomer) in the inkjet composition is volatilized (b).

A monomer having a high vapor pressure (e.g., 0.1 mmHg or more) may be volatilized at a high speed. In this case, vacuum and/or heat may be applied to increase the volatilization speed.

Because the volatile component is volatilized, the concentration of scatterers and quantum dots is increased, and the surface of the inkjet composition that has been coated is relatively lowered.

Meanwhile, the inner surfaces of the banks are coated with scatterers and quantum dots. As a result, the banks may not absorb light to thereby prevent or substantially prevent a decrease in efficiency.

Then, a second jetting is performed utilizing the inkjet composition (c). A volatile component (e.g., a monomer) in the inkjet composition may be volatilized at a high speed. In this case, vacuum and/or heat may be applied to increase the volatilization speed.

Through the above process, the inner sides of the banks of the pixel are coated with scatterers and quantum dots, and a quantum dot layer (e.g., a first quantum dot layer) in which quantum dots are concentrated may be formed on a substrate (e.g., a color filter layer).

The quantum dot layer formed in the pixel may have surface morphology (e.g., surface roughness) occurring due to the volatilization of a volatile component (e.g., a monomer). In this case, an additional process of spraying an inkjet composition of the related art may be optionally performed to resolve the surface morphology of the quantum dot layer.

The "inkjet composition of the related art" refers to an inkjet composition having a low vapor pressure, that is, an inkjet composition including a monomer having a low volatility. In an embodiment, the inkjet composition of the related art may be a second inkjet composition.

In some embodiments, after the quantum dot layer is formed in the pixel, upper portions of the banks remain exposed. Because the inner sides of the banks are coated with scatterers and quantum dots, light absorption of the banks may be reduced or minimized, and light reflection may be increased. Accordingly, it is not required to remove (or coat) the exposed upper portions of the banks separately.

Because the quantum dot layer of the main pixel formed through the process of FIG. 2 has quantum dots and scatterers concentrated therein, luminance may be increased, thereby increasing efficiency of the display apparatus. However, there is a possibility that light transmittance may be lowered, and a color matching rate may be decreased.

In order to prevent or reduce such a possibility, the display apparatus according to an embodiment further includes a sub-pixel for transmitting the light emitted from the light-emitting device.

Figure 3:
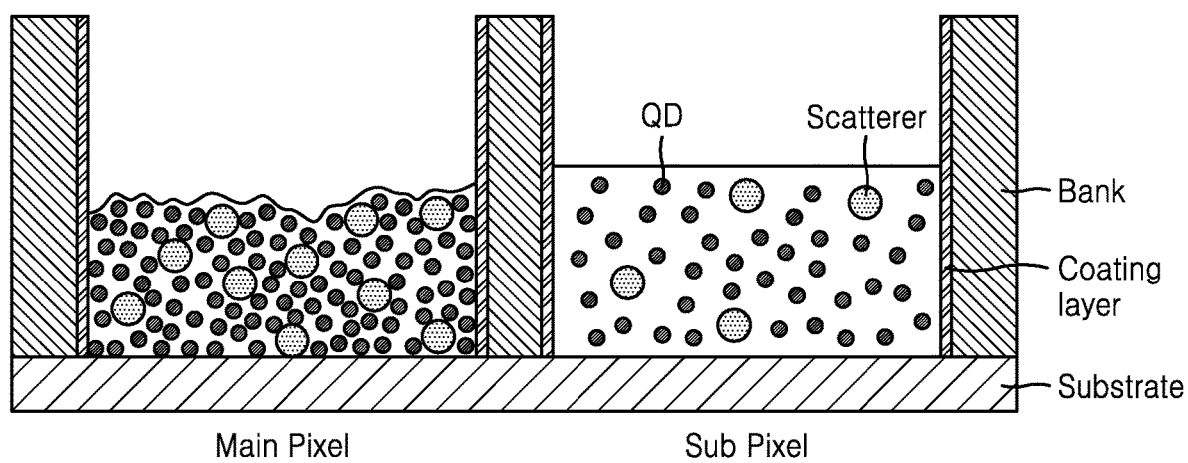
FIG. 3 is a diagram schematically illustrating a main pixel and a sub-pixel of a display apparatus according to an embodiment.

FIG. 3 is a diagram schematically illustrating a main pixel and a sub-pixel of a display apparatus according to an embodiment.

The main pixel of FIG. 3 may be formed through the same process as in FIG. 2.

In an embodiment, inner sides of banks defining the main pixel and/or the sub-pixel may be coated with scatterers and quantum dots. In an embodiment, the inner sides of the banks defining the main pixel may be coated with scatterers and quantum dots, and the inner sides of the banks defining the sub-pixel may not be coated with scatterers and quantum dots.

In an embodiment, a first quantum dot layer of the main pixel may include a layer in which after a first inkjet composition including a first liquid component and a first solid component is sprayed, the first liquid component is volatilized such that the first solid component is concentrated, a second quantum dot layer of the sub-pixel may include a layer in which after a second inkjet composition including a second liquid component and a second solid component is sprayed, the second liquid component is not volatilized.

The first quantum dot layer may be formed, for example, through the process of FIG. 2 described above.

The first inkjet composition includes a first monomer having a high vapor pressure, and the second inkjet composition includes a second monomer having a low vapor pressure. Accordingly, in the first inkjet composition injected into the pixel, the first monomer is easily volatilized and thus is reduced in volume, whereas in the second inkjet composition injected into the pixel, the second monomer is not easily volatilized and thus has little change in volume.

In an embodiment, the first quantum dot layer may include a layer in which after the first inkjet composition including the first liquid component and the first solid component is sprayed, about 5% to about 100% of the first monomer of the first liquid component is volatilized such that the first solid component is concentrated.

In an embodiment, the first quantum dot layer may include a layer in which after the first inkjet composition including the first liquid component and the first solid component is sprayed, about 15% to about 90% of the first monomer of the first liquid component is volatilized such that the first solid component is concentrated.

In an embodiment, the first quantum dot layer may include a layer in which after the first inkjet composition including the first liquid component and the first solid component is sprayed, about 30% to about 80% of the first monomer of the first liquid component is volatilized such that the first solid component is concentrated.

In an embodiment, the first quantum dot layer may include a layer in which after the first inkjet composition including the first liquid component and the first solid component is sprayed, about 50% to about 95% of the first monomer of the first liquid component is volatilized such that the first solid component is concentrated.

The first quantum dot layer of the main pixel is concentrated (e.g., with scatterers and quantum dots), and the second quantum dot layer of the sub-pixel is not concentrated. As a result, as shown in FIG. 3, the first solid component including scatterers and quantum dots may be present in a larger amount in the main pixel, but the second solid component including scatterers and quantum dots may be present in a relatively smaller amount in the sub-pixel.

In an embodiment, the first inkjet composition and the second inkjet composition may each independently have a viscosity of 30 cP or less and a surface energy of about 30 dyne/cm. An inkjet process may proceed without trouble within the above viscosity range, and, in consideration of the surface energy of the banks, it is appropriate that the surface energy of the inkjet compositions is within the above range.

In an embodiment, in the main pixel and the sub-pixel, the first solid component in the first quantum dot layer and the second solid component in the second quantum dot layer may be the same component, and a density of the first solid component in the first quantum dot layer and a density of the second solid component in the second quantum dot layer may be different from each other. In the second quantum dot layer of the sub-pixel, the density of the second solid component may be of any value that is suitable (e.g., optimal) for transmitting the light emitted from the light-emitting device. The density of the second solid component in the second quantum dot layer of the sub-pixel may be lower than the density of the first solid component in the first quantum dot layer of the main-pixel.

Because a first quantum dot layer having a higher concentration of a first solid component including scatterers and quantum dots is to be formed in the main pixel, it is appropriate that the first monomer of the first liquid component of the first inkjet composition is a compound having a high volatility, that is, a compound having a high vapor pressure.

In an embodiment, the first liquid component may include a first monomer, and a vapor pressure of the first monomer may be 0.1 mmHg or more. In an embodiment, the vapor pressure of the first monomer may be 0.1 mmHg or more, and the first monomer may be a compound having a boiling point of 100° C. or less. In an embodiment, the vapor pressure of the first monomer may be from about 1 mmHg to about 750 mmHg. In an embodiment, the vapor pressure of the first monomer may be from about 10 mmHg to about 550 mmHg. In an embodiment, the vapor pressure of the first monomer may be from about 40 mmHg to about 450 mmHg.

The first monomer may be, for example, a composition (e.g., a compound) having acrylate or methacrylate as a terminus (e.g., at a terminal end) and 5 or fewer carbon atoms, and may be a compound in which oxygen is substituted between carbon chains (e.g., 3 methoxybutyl acrylate, 2 hydroxyethyl acrylate, etc.).

Because the sub-pixel transmits the light emitted from the light-emitting device, the density of the second solid component in the second quantum dot layer of the sub-pixel is relatively low. It is appropriate that the second monomer is a compound that is not easily volatilized, that is, a compound having a low vapor pressure.

In an embodiment, the second liquid component may include a second monomer, and a vapor pressure of the second monomer may be $10^{-3}$ mmHg or less.

In an embodiment, the vapor pressure of the second monomer may be $10^{-3}$ mmHg or less, and the second monomer may be a compound having a boiling point of greater than 100° C. In an embodiment, the vapor pressure of the second monomer may be from greater than 0 mmHg to about $10^{-3}$ mmHg.

The second monomer may be, for example, a composition (e.g., a compound) having acrylate or methacrylate as a terminus (e.g., at a terminal end) and 5 or more carbon atoms, and may be a compound in which oxygen is substituted between carbon chains (e.g., tetraethylene glycol diacrylate, di(propylene glycol) diacrylate, tri(propylene glycol) diacrylate, etc.).

The second monomer may be, for example, a composition (e.g., a compound) having acrylate or methacrylate as a terminus (e.g., at a terminal end) and 5 or more and 10 or less carbon atoms, and may be a compound in which oxygen is substituted between carbon chains.

In an embodiment, the first solid component may include scatterers and quantum dots, wherein an amount of the scatterers may be from greater than 0 wt % to about 10 wt %, and an amount of the quantum dots may be from about 5 wt % to about 60 wt %, based on a total weight of the first inkjet composition. In an embodiment, the amount of the scatterers may be from about 3 wt % to about 7 wt %, and the amount of the quantum dots may be from about 15 wt % to about 55 wt %, based on the total weight of the first inkjet composition.

When the amounts of the scatterers and the quantum dots are within the above respective ranges based on the total 100 wt % of the first inkjet composition, an absorption rate and efficiency of the first quantum dot layer concentrated in the main pixel may be desirable (e.g., optimized).

In an embodiment, the second solid component may include scatterers and/or quantum dots, wherein an amount of the second solid component may be from about 0.1 wt % to 60 wt % or less based on a total weight of the second inkjet composition.

In an embodiment, the amount of the second solid component may be from about 0.5 wt % to about 50 wt % based on the total weight of the second inkjet composition. In an embodiment, the amount of the second solid component may be from about 1 wt % to about 20 wt % based on the total weight of the second inkjet composition.

When the amount of the second solid component is within the above ranges based on the total 100 wt % of the second inkjet composition, the density of the second solid component in the second quantum dot layer of the sub-pixel may be of a value that is desirable (e.g., optimal) for transmitting the light emitted by the light-emitting device.

Meanwhile, because the sub-pixel transmits the light emitted by the light-emitting device, the sub-pixel may include only quantum dots or may include only scatterers, depending on the characteristics of the light. That is, depending on the characteristics of the light, the second solid component may include only quantum dots or may include only scatterers.

The filling material 300 is located between the first substrate 110 and the second substrate 210, wherein the filling material functions as both a gap maintainer that maintains an appropriate distance between the two substrates 110 and 210 and a bonding agent. Accordingly, when the filling material 300 is coated between the two substrates 110 and 210, which are then bonded together, the filling material 300 firmly bonds the two substrates 110 and 210 while properly maintaining a gap therebetween.

The display apparatus having the above structure may be manufactured through the process shown in FIGS. 4A to 4F.

Figure 4A:
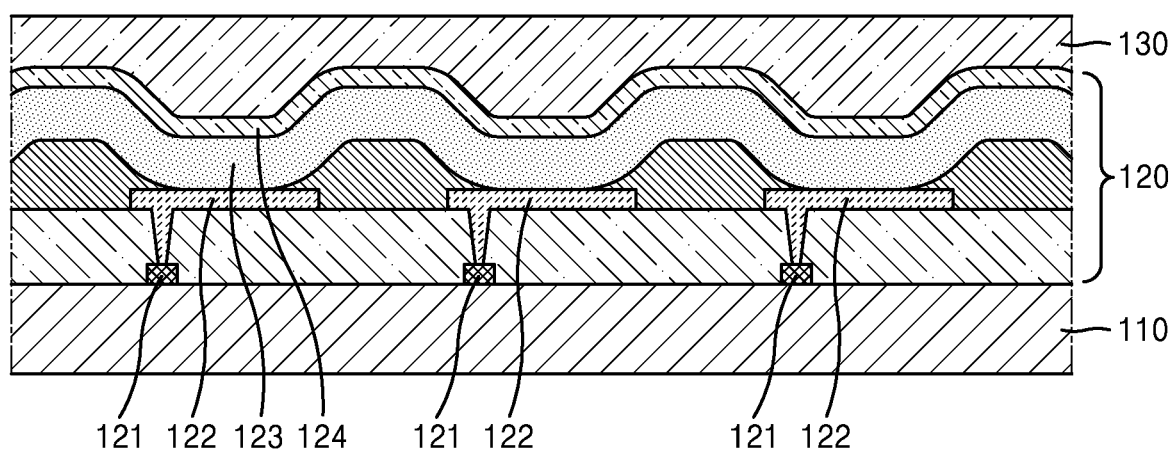
FIGS. 4A-4F are cross-sectional views sequentially illustrating a process of manufacturing the display apparatus shown in FIG. 1.

First, as shown in FIG. 4A, the light-emitting device 120 is formed on the first substrate 110 and is covered with the thin-film encapsulation layer 130.

Figure 4B:
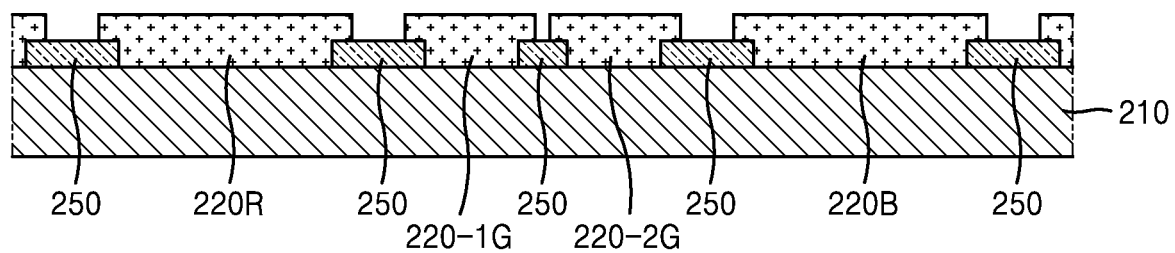

Then, as shown in FIG. 4B, the black matrix 250 and the color filter layers 220R, 220-1G, 220-2G, and 220B are each formed on the second substrate 210 through a photolithography process. The color filter layers 220R, 220-1G, 220-2G, and 220B are each formed at a position corresponding to the light-emitting device 120.

Figure 4C:
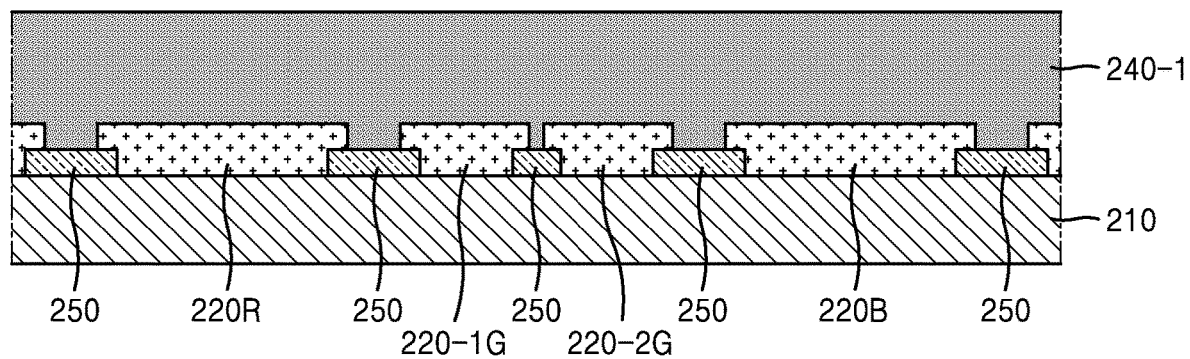

Then, as shown in FIG. 4C, tops of the color filter layers 220R, 220-1G, 220-2G, and 220B and the black matrix 250 are coated with a composite polymer 240-1 and then heated, wherein, in the composite polymer, a fluorine-containing polymer (such as polytetrafluoroethylene (PTFE), perfluoropolyether (PFPE), or any combination thereof), a curable polymer, a photoresist compound, a black pigment, and a solvent are mixed. That is, the composite polymer 240-1, in which a fluorine-containing polymer containing fluorine (F), a curable polymer, a photoresist compound, a black pigment, and a solvent are mixed, is prepared to be coated on the color filter layers 220R, 220-1G, 220-2G, and 220B and the black matrix 250, which are then heated.

A curing temperature of the bank 240 may be within a temperature range that does not affect quantum dot efficiency. In an embodiment, the curing temperature of the bank 240 may be from about 80° C. to about 250° C.

Figure 4D:
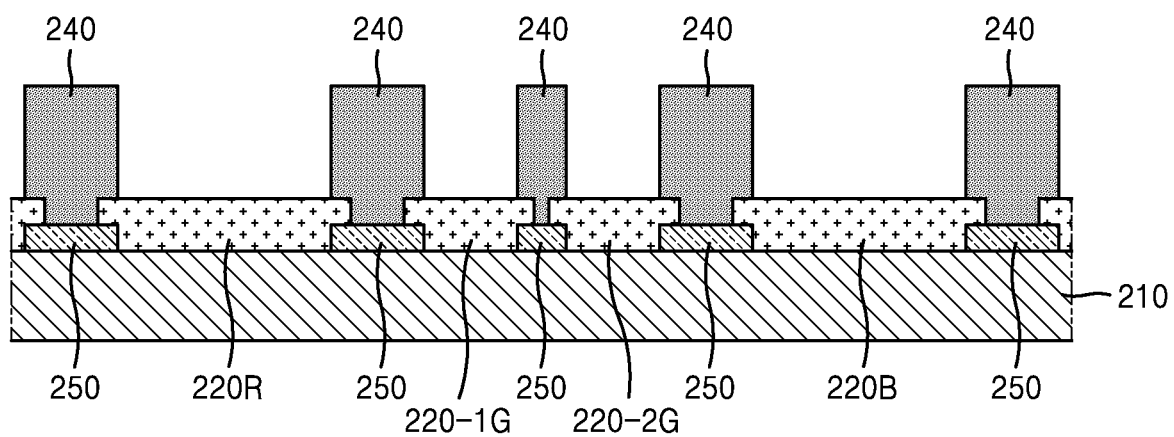

Also, as shown in FIG. 4D, the composite polymer 240-1 is patterned to remain at each position between the color filter layers 220R, 220-1G, 220-2G, and 220B between each pixel (e.g., between adjacent pixels).

In an embodiment, the bank 240 may not include a scatterer. Because the surface of the bank 240 is coated with scatterers and quantum dots, the bank 240 itself may not include a scatterer.

Figure 4E:
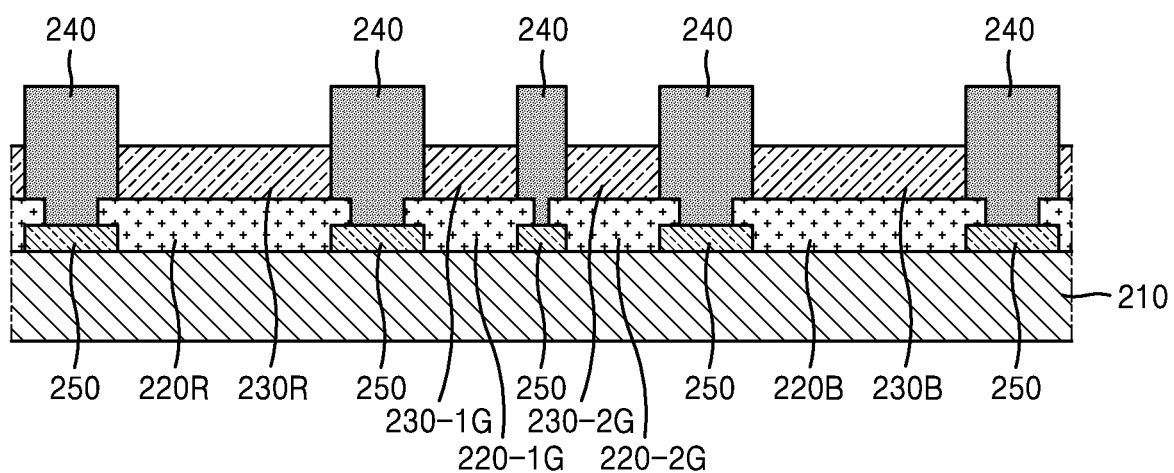

Afterwards, as shown in FIG. 4E, the quantum dot layers 230R, 230-1G, 230-2G, and 230B are formed in the red pixel, the green main pixel, the green sub-pixel, and the blue pixel. In this regard, the quantum dot layers 230R, 230-1G, 230-2G, and 230B are formed at positions overlapping with the color filter layers 220R, 220-1G, 220-2G, and 220B. The quantum dot layers 230R, 230-1G, 230-2G, and 230B may be formed through an inkjet process.

As described above, when forming the first quantum dot layer 230-1G in the green main pixel, after a first inkjet composition including a first liquid component and a first solid component is sprayed, the first liquid component may be volatilized to thereby form a layer in which the first solid component is concentrated.

As described above, when forming the second quantum dot layer 230-2G in the green sub-pixel, after a second inkjet composition including a second liquid component and a second solid component is sprayed, a layer in which the second liquid component is not volatilized may be formed.

In an embodiment, the first inkjet composition and the second inkjet composition may each independently further include a solvent, a light-emitting organic material, a dispersant, a curing agent, or any combination thereof.

In an embodiment, the solvent may include propylene glycol methyl ether acetate (PGMEA), dimethylacetamide (DMA), γ-butyrolactone (GBL), cyclohexylamine (CHA), dipropyleneglycol monomethyl ether acetate (DPMA), or any combination thereof.

In an embodiment, the light-emitting organic material may include Stilbene 3, Coumarin 120, Coumarin 1, Coumarin 6, Coumarin 47, Coumarin 102, Coumarin 307, Coumarin 153, Rhodamin 6G, Sulforhodamin B, Pyromethene 597, Rhodamin B, Rodamin B/101, Rhodamin 101, DCM, Pyridin 1, Pyridin 2, Styryl 8, Styryl 9, or any combination thereof. The light-emitting organic material may increase efficiency of the display apparatus in a manner different from a quantum dot. In an embodiment, the light-emitting organic material may emit light by absorbing light from a light-emitting device which has not been absorbed by the quantum dot.

In an embodiment, the dispersant may include an amine-based dispersant, an acid-based dispersant, or any combination thereof.

In an embodiment, the curing agent may include a thermosetting agent, a photocuring agent, or any combination thereof. When the first inkjet composition and the second inkjet composition include curing agents, heat and/or light may be applied to the first quantum dot layer of the main pixel and the second quantum dot layer of the sub-pixel to cure the first quantum dot layer and the second quantum dot layer.

In an embodiment, the first solid component and the second solid component respectively included in the first inkjet composition and the second inkjet composition may each independently include a scatterer including a metal, a metal oxide, a non-metal oxide, or any combination thereof.

In an embodiment, the scatterer may be utilized by substituting an amine-based ligand or an acid-based ligand.

In an embodiment, the scatterer may include Ag, Al, $SiO_2$, $BaSO_4$, $Al_2O_3$, ZnO, $ZrO_2$, $TiO_2$, or any combination thereof.

In an embodiment, the first solid component and the second solid component may each independently include a quantum dot including a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

The quantum dot layers 230R, 230-1G, 230-2G, and 230B may include the quantum dot.

Examples of the Group III-VI semiconductor compound may include: a binary compound, such as $In_2S_3$; a ternary compound, such as AgInS, $AgInS_2$, CuInS, and/or $CuInS_2$; or any combination thereof.

Examples of the Group II-VI semiconductor compound may include: a binary compound, such as CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the Group III-V semiconductor compound may include: a binary compound, such as GaN, GaP, GaAs, GaSb, AlN, AlP, AlAs, AlSb, InN, InP, InAs, and/or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and/or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb; or any combination thereof. Meanwhile, the Group III-V semiconductor compound may further include a Group II element. Examples of the Group III-V semiconductor compound further including a Group II element may include InZnP, InGaZnP, InAlZnP, etc.

Examples of the Group III-VI semiconductor compound may include: a binary compound, such as GaS, GaSe, $Ga_2Se_3$, GaTe, InS, InSe, $In_2Se_3$, and/or InTe; a ternary compound, such as $InGaS_3$ and/or $InGaSe_3$; or any combination thereof.

Examples of the Group I-III-VI semiconductor compound may include: a ternary compound, such as AgInS, $AgInS_2$, CuInS, $CuInS_2$, $CuGaO_2$, $AgGaO_2$, and/or $AgAlO_2$; or any combination thereof.

Examples of the Group IV-VI semiconductor compound may include: a binary compound, such as SnS, SnSe, SnTe, PbS, PbSe, and/or PbTe; a ternary compound, such as SnSeS, SnSeTe, SnSTe, PbSeS, PbSeTe, PbSTe, SnPbS, SnPbSe, and/or SnPbTe; a quaternary compound, such as SnPbSSe, SnPbSeTe, and/or SnPbSTe; or any combination thereof.

The Group IV element or compound may include: a single element compound, such as Si and/or Ge; a binary compound, such as SiC and/or SiGe; or any combination thereof.

Each element included in a multi-element compound such as the binary compound, the ternary compound, and the quaternary compound, may be present at a uniform concentration or a non-uniform concentration in a particle.

The quantum dot may have a single structure or a dual core-shell structure. In the case of the quantum dot having a single structure, the concentration of each element included in the corresponding quantum dot may be uniform. In an embodiment, in a quantum dot having a dual core-shell structure, the material contained in the core and the material contained in the shell may be different from each other.

The shell of the quantum dot may act (e.g., serve) as a protective layer to prevent or reduce chemical degeneration of the core to maintain semiconductor characteristics and/or as a charging layer to impart electrophoretic characteristics to the quantum dot. The shell may be a single layer or a multi-layer. The interface between the core and the shell may have a concentration gradient in which the concentration of an element present in the shell is decreased towards the center of the core.

Examples of the shell of the quantum dot may be an oxide of metal, metalloid, or non-metal, a semiconductor compound, or any combination thereof. Examples of the oxide of metal, metalloid, or non-metal may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound, such as $MgAl_2O_4$, $CoFe_2O_4$, $NiFe_2O_4$, and/or $CoMn_2O_4$; or any combination thereof. Examples of the semiconductor compound may include, as described herein, Group II-VI semiconductor compounds; Group III-V semiconductor compounds; Group III-VI semiconductor compounds; Group I-III-VI semiconductor compounds; Group IV-VI semiconductor compounds; or any combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be about 45 nm or less, for example, about 40 nm or less, or, about 30 nm or less, and within these ranges, color purity or color gamut (e.g., color reproducibility) may be increased. In addition, because the light emitted through the quantum dot is emitted in all directions, a wide viewing angle may be improved.

In addition, the quantum dot may be a spherical particle, a pyramidal particle, a multi-arm particle, a cubic nanoparticle, a nanotube particle, a nanowire particle, a nanofiber particle, and/or a nanoplate particle.

Because the energy band gap may be adjusted by controlling the size of the quantum dot, light having various suitable wavelength bands may be obtained from the quantum dot emission layer. Accordingly, by utilizing quantum dots of different sizes, a light-emitting device that emits light of various suitable wavelengths may be implemented. In one or more embodiments, the size of the quantum dot may be selected to emit red, green and/or blue light. In addition, the size of the quantum dot may be configured to emit white light by combining light of various suitable colors.

Figure 4F:
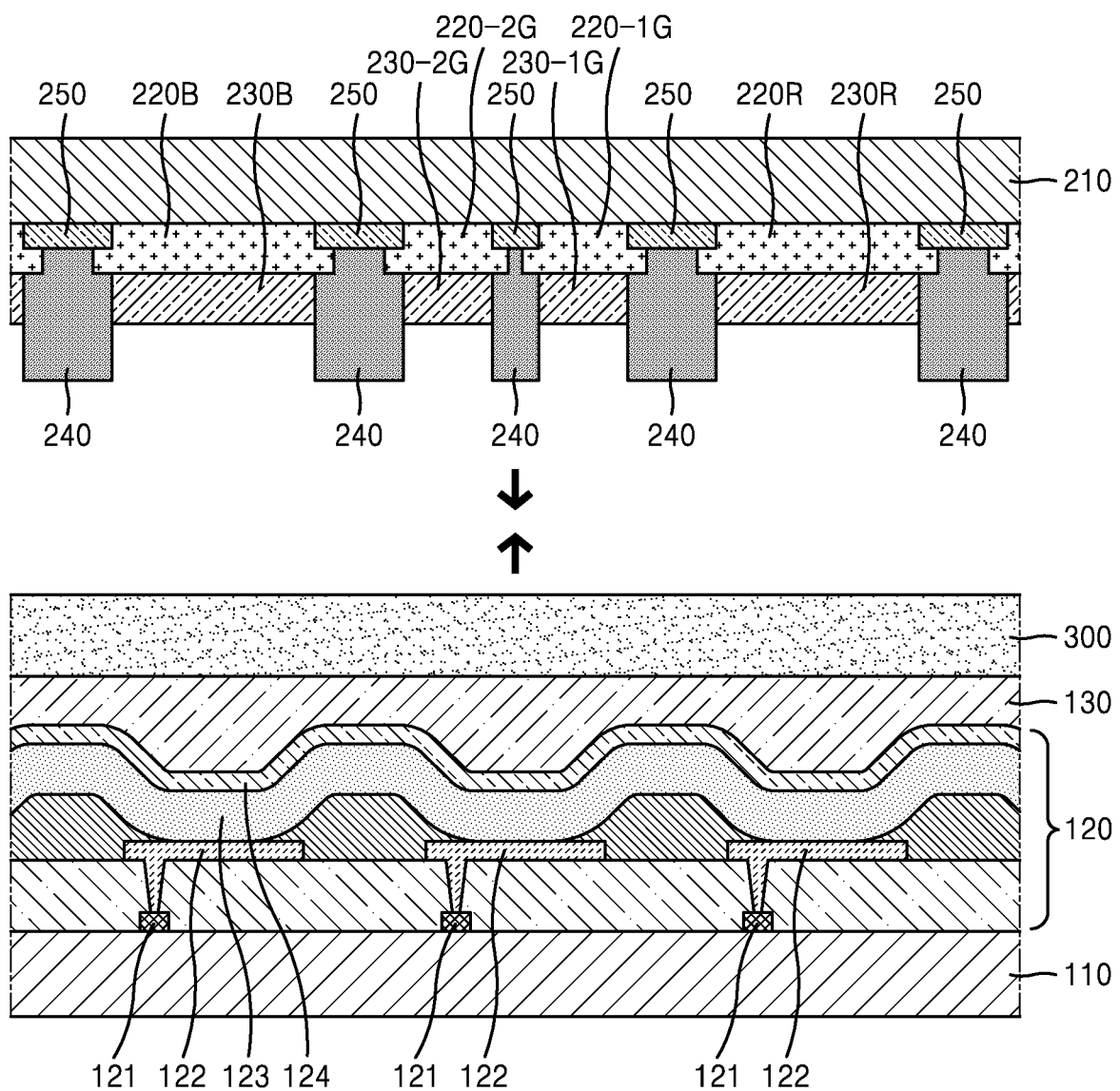

After forming such quantum dot layers 230R, 230-1G, 230-2G, and 230B, as shown in FIG. 4F, the filling material 300 is applied between the first substrate 110 and the second substrate 210, and the two substrates 110 and 210 are bonded together. As a result, as shown in FIG. 1, a display apparatus including the light-emitting device 120, the quantum dot layers 230R, 230-1G, 230-2G, and 230B, and the color filter layers 220R, 220-1G, 220-2G, and 220B is implemented.

Figure 5:
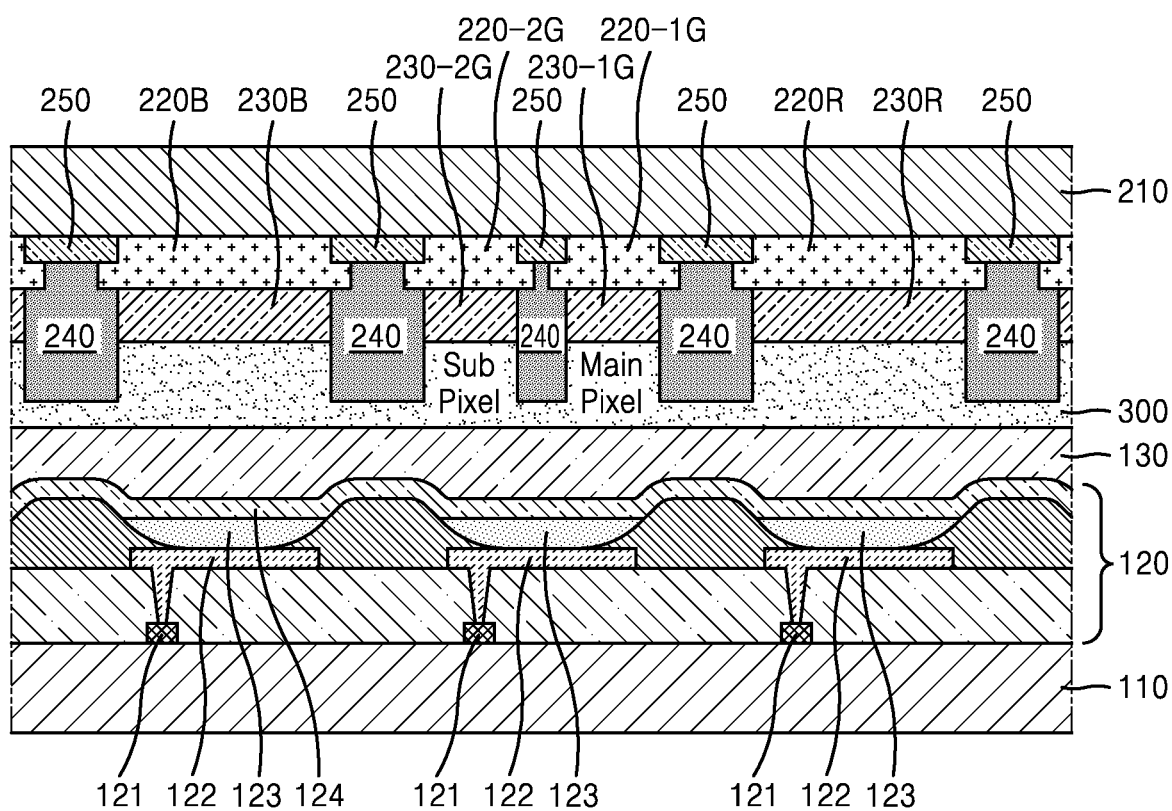
FIG. 5 is a cross-sectional view of a display apparatus according to an embodiment.

The present embodiment illustrates a case in which the interlayer 123 including the emission layer is formed as a common layer across the entire pixel area. However, as shown in FIG. 5, a modification in which an interlayer is separately formed for each pixel is also possible. That is, the interlayer 123 including the emission layer may be formed as a common layer, or may be formed (e.g., patterned) separately for each pixel.

The emission layer may include an organic light-emitting material or an inorganic light-emitting material.

The light-emitting device 120 will be described in more detail.

First Electrode 122

In FIG. 1, a substrate may be additionally located under the first electrode 122 or above the second electrode 124. As the substrate, a glass substrate and/or a plastic substrate may be utilized.

The first electrode 122 may be formed by, for example, depositing or sputtering a material for forming the first electrode 122 on the substrate. When the first electrode 122 is an anode, a material for forming the first electrode 122 may be a high work function material that facilitates injection of holes.

The first electrode 122 may be a reflective electrode, a semi-transmissive electrode, or a transmissive electrode. When the first electrode 122 is a transmissive electrode, a material for forming the first electrode 122 may include indium tin oxide (ITO), indium zinc oxide (IZO), tin oxide ($SnO_2$), zinc oxide (ZnO), or any combinations thereof. In one or more embodiments, when the first electrode 122 is a semi-transmissive electrode or a reflective electrode, magnesium (Mg), silver (Ag), aluminum (Al), aluminum-lithium (Al-Li), calcium (Ca), magnesium-indium (Mg-In), magnesium-silver (Mg-Ag), or any combination thereof may be utilized as a material for forming the first electrode 122.

The first electrode 122 may have a single-layered structure consisting of a single layer or a multi-layered structure including a plurality of layers. In an embodiment, the first electrode 122 may have a three-layered structure of ITO/Ag/ITO.

Interlayer 123

The interlayer 123 may be located on the first electrode 122. The interlayer 123 may include an emission layer.

The interlayer 123 may further include a hole transport region located between the first electrode 122 and the emission layer and an electron transport region located between the emission layer and the second electrode 124.

The interlayer 123 may further include, in addition to various suitable organic materials, metal-containing compounds such as organometallic compounds, inorganic materials such as quantum dots, and/or the like.

In one or more embodiments, the interlayer 123 may include, i) two or more light-emitting units sequentially stacked between the first electrode 122 and the second electrode 124 and ii) a charge generation layer located between the two or more emitting units. When the interlayer 123 includes the emitting unit and the charge generation layer as described above, the light-emitting device 120 may be a tandem light-emitting device.

Hole Transport Region in Interlayer 123

The hole transport region may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The hole transport region may include a hole injection layer, a hole transport layer, an emission auxiliary layer, an electron-blocking layer, or any combination thereof.

In an embodiment, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 122.

The hole transport region may include a compound represented by Formula 201, a compound represented by Formula 202, or any combination thereof:

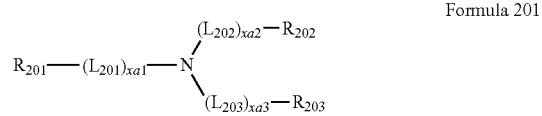

Formula 201

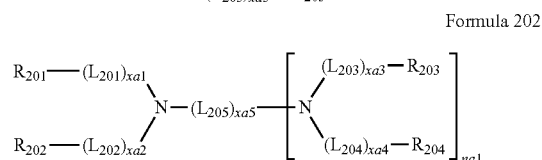

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (e.g., a carbazole group or the like) unsubstituted or substituted with at least one $R_{10a}$ (e.g., Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, each of Formulae 201 and 202 may include at least one of the groups represented by Formulae CY201 to CY217:

CY201

CY202

-continued

CY203
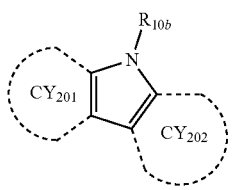

CY204
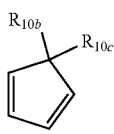

CY205
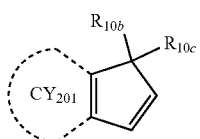

CY206
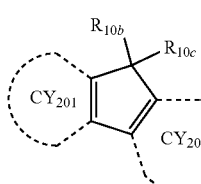

CY207
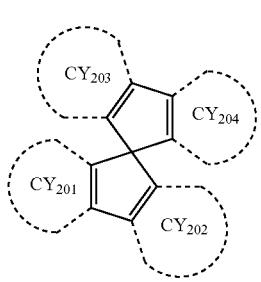

CY208
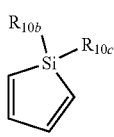

CY209
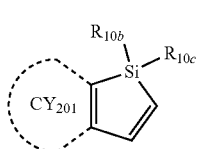

CY210
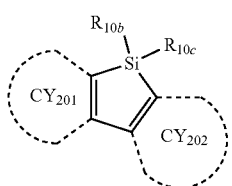

-continued

CY211
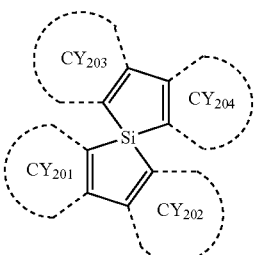

CY212

CY213
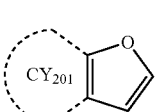

CY214
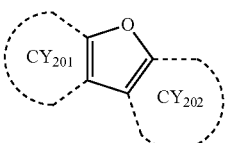

CY215

CY216
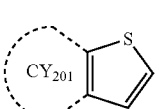

CY217
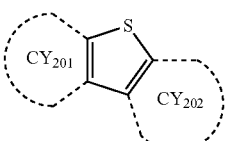

wherein, in Formulae CY201 to CY217, $R_{10b}$ and $R_{10c}$ are each the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron-blocking layer may block or reduce the leakage (e.g., flow) of electrons from an emission layer to a hole transport region. Materials that may be included in the hole transport region may be included in the emission auxiliary layer and the electron blocking layer.

p-Dopant

The hole transport region may further include, in addition to the materials described above, a charge-generation material for the improvement of conductive properties. The charge-generation material may be uniformly or non-uniformly dispersed in the hole transport region (e.g., in the form of a single layer consisting of a charge-generation material).

The charge-generation material may be, for example, a p-dopant.

In an embodiment, a lowest unoccupied molecular orbital (LUMO) energy level of the p-dopant may be −3.5 eV or less.

In an embodiment, the p-dopant may include a quinone derivative, a cyano group-containing compound, a compound containing element EL1 and element EL2, or any combination thereof.

Examples of the quinone derivative may include TCNQ, F4-TCNQ, etc.

Examples of the cyano group-containing compound may include HAT-CN and a compound represented by Formula 221.

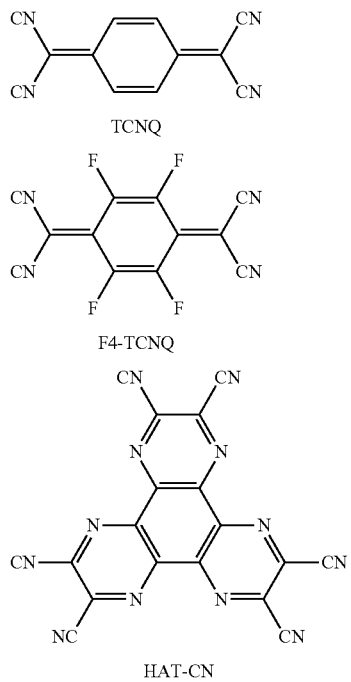

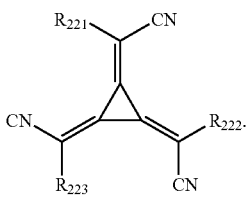

Formula 221

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be a metal, a metalloid, or any combination thereof, and element EL2 may be a non-metal, a metalloid, or any combination thereof.

Emission Layer in Interlayer 123

When the light-emitting device 120 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact each other or are separated from each other. In one or more embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

An amount of the dopant in the emission layer may be from about 0.01 parts by weight to about 15 parts by weight based on 100 parts by weight of the host.

In one or more embodiments, the emission layer may include a quantum dot. The quantum dot is the same as described above.

Meanwhile, the emission layer may include a delayed fluorescence material. The delayed fluorescence material may act (e.g., serve) as a host or a dopant in the emission layer.

A thickness of the emission layer may be in a range of about 100 Å to about 1,000 Å, for example, about 200 Å to about 600 Å. When the thickness of the emission layer is within these ranges, suitable (e.g., excellent) light-emission characteristics may be obtained without a substantial increase in driving voltage.

Host

The host may include a compound represented by Formula 301:

$$[Ar_{301}]_{xb11}-[(L_{301})_{xb1}-R_{301}]_{xb21}$$ Formula 301 wherein, in Formula 301,

Ar$_{301}$ and L$_{301}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, xb11 may be 1, 2, or 3, xb1 may be an integer from 0 to 5, R$_{301}$ may be hydrogen, deuterium, —F, —Cl, —Br, —I, a hydroxyl group, a cyano group, a nitro group, a C$_1$-C$_{60}$ alkyl group unsubstituted or substituted with at least one R$_{10a}$, a C$_2$-C$_{60}$ alkenyl group unsubstituted or substituted with at least one R$_{10a}$, a C$_2$-C$_{60}$ alkynyl group unsubstituted or substituted with at least one R$_{10a}$, a C$_1$-C$_{60}$ alkoxy group unsubstituted or substituted with at least one R$_{10a}$, a C$_3$-C$_{60}$ carbocyclic group unsubstituted or substituted with at least one R$_{10a}$, a C$_1$-C$_{60}$ heterocyclic group unsubstituted or substituted with at least one R$_{10a}$, —Si(Q$_{301}$)(Q$_{302}$)(Q$_{303}$), —N(Q$_{301}$)(Q$_{302}$), —B(Q$_{301}$)(Q$_{302}$), —C(=O)(Q$_{301}$), —S(=O)$_2$(Q$_{301}$), or —P(=O)(Q$_{301}$)(Q$_{302}$), xb21 may be an integer from 1 to 5, and Q$_{301}$ to Q$_{303}$ are the same as described in connection with Q$_1$.

In an embodiment, when xb11 in Formula 301 is 2 or more, two or more of Ar$_{301}$(s) may be linked to each other via a single bond.

In one or more embodiments, the host may include a compound represented by Formula 301-1, a compound represented by Formula 301-2, or any combination thereof:

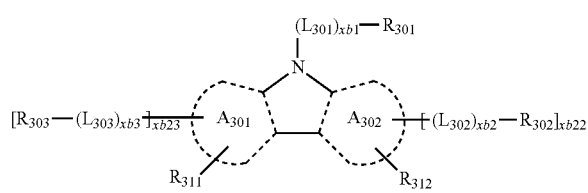

Formula 301-1

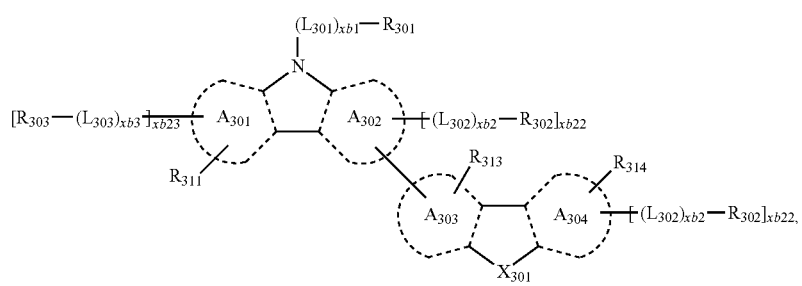

Formula 301-2 wherein, in Formulae 301-1 and 301-2, ring A$_{301}$ to ring A$_{304}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, X$_{301}$ may be O, S, N-[(L$_{304}$)$_{xb4}$-R$_{304}$], C(R$_{304}$)(R$_{305}$), or Si(R$_{304}$)(R$_{305}$), xb22 and xb23 may each independently be 0, 1, or 2, L$_{301}$, xb1, and R$_{301}$ may each the same as respectively described in the present specification, L$_{302}$ to L$_{304}$ may each independently be the same as described in connection with L$_{301}$, xb2 to xb4 may each independently be the same as described in connection with xb1, and R$_{302}$ to R$_{305}$ and R$_{311}$ to R$_{314}$ may each independently be the same as described in connection with R$_{301}$.

Phosphorescent Dopant

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

$$M(L_{401})_{xc1}(L_{402})_{xc2}$$

Formula 401

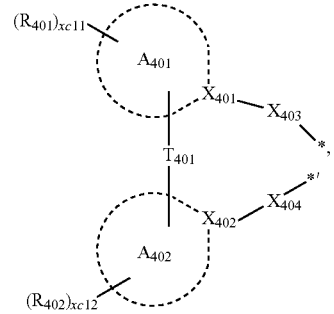

Formula 402 wherein, in Formulae 401 and 402,

M may be a transition metal (e.g., iridium (Ir), platinum (Pt), palladium (Pd), osmium (Os), titanium (Ti), gold (Au) hafnium (Hf), europium (Eu), terbium (Tb), rhodium (Rh), rhenium (Re), and/or thulium (Tm)), L$_{401}$ may be a ligand represented by Formula 402, and xc1 may be 1, 2, or 3, wherein when xc1 is 2 or more, two or more of L$_{401}$(s) may be identical to or different from each other, L$_{402}$ may be an organic ligand, and xc2 may be 0, 1, 2, 3, or 4, wherein when xc2 is 2 or more, two or more of L$_{402}$(s) may be identical to or different from each other, X$_{401}$ and X$_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C=, $X_{403}$ and $X_{404}$ may each independently be a chemical bond (e.g., a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are the same as described in connection with $Q_1$, xc11 and xc12 may each independently be an integer from 0 to 10, and and *' in Formula 402 each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 401 is 2 or more, two ring $A_{401}$(s) in two or more $L_{401}$(s) may be optionally linked to each other via $T_{402}$, which is a linking group, and/or two ring $A_{402}$(s) in two or more $L_{401}$(s) may optionally be linked to each other via $T_{403}$, which is a linking group (see, e.g., Compounds PD1 to PD4 and PD7). $T_{402}$ and $T_{403}$ are the same as described in connection with $T_{401}$.

$L_{402}$ in Formula 401 may be an organic ligand. In an embodiment, $L_{402}$ may include a halogen group, a diketone group (e.g., an acetylacetonate group), a carboxylic acid group (e.g., a picolinate group), —C(=O), an isonitrile group, a —CN group, a phosphorus group (e.g., a phosphine group, a phosphite group, etc.), or any combination thereof.

Fluorescent Dopant

The fluorescent dopant may include an amine group-containing compound, a styryl group-containing compound, or any combination thereof.

In an embodiment, the fluorescent dopant may include a compound represented by Formula 501:

$$Ar_{501}\left[-(L_{503})_{xd3}-N\begin{matrix}(L_{501})_{xd1}-R_{501}\\ (L_{502})_{xd2}-R_{502}\end{matrix}\right]_{xd4} \quad \text{Formula 501}$$

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (e.g., an anthracene group, a chrysene group, and/or a pyrene group) in which three or more monocyclic groups are condensed together.

In one or more embodiments, xd4 in Formula 501 may be 2.

Delayed Fluorescence Material

The emission layer may include a delayed fluorescence material.

In the present specification, the delayed fluorescence material may be selected from compounds capable of emitting delayed fluorescent light based on a delayed fluorescence emission mechanism.

The delayed fluorescence material included in the emission layer may act (e.g., serve) as a host or a dopant depending on the type (or kind) of other materials included in the emission layer.

In an embodiment, a difference between a triplet energy level (eV) of the delayed fluorescence material and a singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 120 may be improved.

In an embodiment, the delayed fluorescence material may include i) a material including at least one electron donor (e.g., a π electron-rich $C_3$-$C_{60}$ cyclic group, such as a carbazole group) and at least one electron acceptor (e.g., a sulfoxide group, a cyano group, and/or a π electron-deficient nitrogen-containing $C_1$-$C_{60}$ cyclic group), and/or ii) a material including a $C_8$-$C_{60}$ polycyclic group in which two or more cyclic groups are condensed while sharing boron (B).

Electron Transport Region in Interlayer 123

The electron transport region may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from an emission layer.

The electron transport region (e.g., the buffer layer, the hole blocking layer, the electron control layer, and/or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601:

$$[Ar_{601}]_{xe11}-[(L_{601})_{xe1}-R_{601}]_{xe21} \quad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ are the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$(s) may be linked to each other via a single bond.

In one or more embodiments, $Ar_{601}$ in Formula 601 may be a substituted or unsubstituted anthracene group.

In one or more embodiments, the electron transport region may include a compound represented by Formula 601-1:

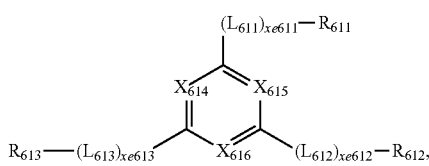

Formula 601-1 wherein, in Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

A thickness of the electron transport region may be from about 100 Å to about 5,000 Å, for example, about 160 Å to about 4,000 Å. When the electron transport region includes a buffer layer, a hole blocking layer, an electron control layer, an electron transport layer, or any combination thereof, a thickness of the buffer layer, the hole blocking layer, and/or the electron control layer may each independently be from about 20 Å to about 1,000 Å, for example, about 30 Å to about 300 Å, and a thickness of the electron transport layer may be from about 100 Å to about 1,000 Å, for example, about 150 Å to about 500 Å. When the thicknesses of the buffer layer, the hole blocking layer, the electron control layer, the electron transport layer and/or the electron transport layer are within these ranges, satisfactory electron transporting characteristics may be obtained without a substantial increase in driving voltage.

The electron transport region (e.g., the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

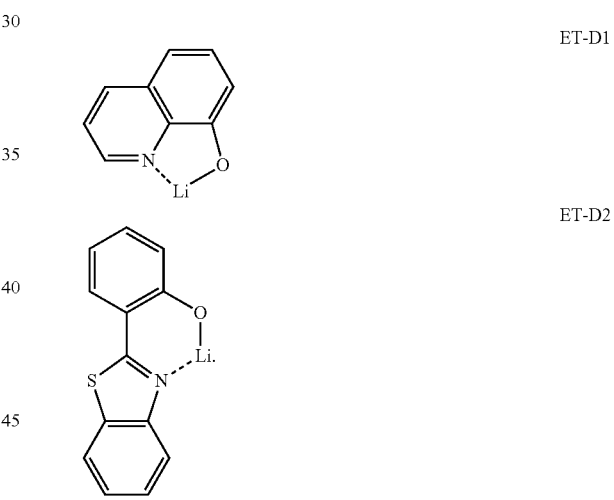

The electron transport region may include an electron injection layer that facilitates the injection of electrons from the second electrode 124. The electron injection layer may directly contact the second electrode 124.

The electron injection layer may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include one or more oxides, halides (e.g., fluorides, chlorides, bromides, or iodides), and/or tellurides of the alkali metal, the alkaline earth metal, and the rare earth metal, or any combination thereof.

The alkali metal-containing compound may include alkali metal oxides (such as $Li_2O$, $Cs_2O$, and/or $K_2O$), alkali metal halides (such as LiF, NaF, CsF, KF, LiI, NaI, CsI, and/or KI), or any combination thereof. The alkaline earth metal-containing compound may include an alkaline earth metal compound, such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (e.g., a compound represented by Formula 601).

In an embodiment, the electron injection layer may include (e.g., consist of) i) an alkali metal-containing compound (e.g., an alkali metal halide), or may include (e.g., consist of) ii) a) an alkali metal-containing compound (e.g., an alkali metal halide) and b) an alkali metal, an alkaline earth metal, a rare earth metal, or any combination thereof. In an embodiment, the electron injection layer may be a KI:Yb co-deposited layer, an RbI:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within these ranges, satisfactory electron injection characteristics may be obtained without a substantial increase in driving voltage.

Second Electrode 124

The second electrode 124 may be located on the interlayer 123. The second electrode 124 may be a cathode, which is an electron injection electrode, and as the material for the second electrode 124, a metal, an alloy, an electrically conductive compound, or any combination thereof, each having a low work function, may be utilized.

The second electrode 124 may include lithium (Li), silver (Ag), magnesium (Mg), aluminum (Al), aluminum-lithium (Al-Li), calcium (Ca), magnesium-indium (Mg-In), magnesium-silver (Mg-Ag), ytterbium (Yb), silver-ytterbium (Ag-Yb), ITO, IZO, or any combination thereof. The second electrode 124 may be a transmissive electrode, a semi-transmissive electrode, or a reflective electrode.

The second electrode 124 may have a single-layered structure or a multi-layered structure including two or more layers.

Capping Layer

A first capping layer may be located outside the first electrode 122, and/or a second capping layer may be located outside the second electrode 124. In some embodiments, the light-emitting device 120 may have a structure in which the first capping layer, the first electrode 122, the interlayer 123, and the second electrode 124 are sequentially stacked in this stated order, a structure in which the first electrode 122, the interlayer 123, the second electrode 124, and the second capping layer are sequentially stacked in this stated order, or a structure in which the first capping layer, the first electrode 122, the interlayer 123, the second electrode 124, and the second capping layer are sequentially stacked in this stated order.

Light generated in the emission layer of the interlayer 123 of the light-emitting device 120 may be extracted toward (e.g., transmitted or provided to) the outside through the first electrode 122, which is a semi-transmissive electrode or a transmissive electrode, and the first capping layer and/or light generated in the emission layer of the interlayer 123 of the light-emitting device 120 may be extracted toward (e.g., transmitted or provided to) the outside through the second electrode 124, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 120 is increased, so that the luminescence efficiency of the light-emitting device 120 may be improved.

Each of the first capping layer and second capping layer may include a material having a refractive index (at 589 nm) of 1.6 or more.

The first capping layer and the second capping layer may each independently be an organic capping layer including an organic material, an inorganic capping layer including an inorganic material, or a composite capping layer including an organic material and an inorganic material.

At least one of the first capping layer or the second capping layer may each independently include one or more carbocyclic compounds, one or more heterocyclic compounds, one or more amine group-containing compounds, one or more porphyrin derivatives, one or more phthalocyanine derivatives, one or more naphthalocyanine derivatives, one or more alkali metal complexes, one or more alkaline earth metal complexes, or any combination thereof. The carbocyclic compound, the heterocyclic compound, and/or the amine group-containing compound may be optionally substituted with a substituent including O, N, S, Se, Si, F, Cl, Br, I, or any combination thereof. In an embodiment, at least one of the first capping layer or the second capping layer may each independently include an amine group-containing compound.

In an embodiment, at least one of the first capping layer or the second capping layer may each independently include a compound represented by Formula 201, a compound represented by Formula 202, or any combination thereof.

Manufacture Method

Respective layers included in the hole transport region, the emission layer, and respective layers included in the electron transport region may be formed in a certain region by utilizing one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

When layers constituting the hole transport region, the emission layer, and layers constituting the electron transport region are formed by spin coating, the spin coating may be performed at a coating speed of about 2,000 rpm to about 5,000 rpm and at a heat treatment temperature of about 80° C. to 200° C. by taking into account a material to be included in a layer to be formed and the structure of a layer to be formed.

Definition of Terms

The term "$C_3$-$C_{60}$ carbocyclic group" as used herein refers to a cyclic group consisting of only carbon atoms as ring-forming atoms and having 3 to 60 carbon atoms, and the term "$C_1$-$C_{60}$ heterocyclic group" as used herein refers to a cyclic group that has, in addition to one to sixty carbon atoms, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. In an embodiment, the $C_1$-$C_{60}$ heterocyclic group may have 3 to 61 ring-forming atoms.

The term "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has 3 to 60 ring-forming carbon atoms and does not include *—N=*' as a ring-forming moiety, and the term "π electron-deficient nitrogen-containing $C_1$-$C_{60}$ cyclic group" as used herein refers to a heterocyclic group that has 1 to 60 ring-forming carbon atoms and includes *—N=*' as a ring-forming moiety.

In an embodiment, the $C_3$-$C_{60}$ carbocyclic group may be i) group T1 or ii) a condensed cyclic group in which two or more groups T1 are condensed with each other (e.g., the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, and/or an indenoanthracene group), the $C_1$-$C_{60}$ heterocyclic group may be i) group T2, ii) a condensed cyclic group in which two or more groups T2 are condensed with each other, or iii) a condensed cyclic group in which at least one group T2 and at least one group T1 are condensed with each other (e.g., the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzisoxazole group, a benzothiazole group, a benzisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which two or more groups T1 are condensed with each other, iii) group T3, iv) a condensed cyclic group in which two or more groups T3 are condensed with each other, or v) a condensed cyclic group in which at least one group T3 and at least one group T1 are condensed with each other (e.g., the π electron-rich $C_3$-$C_{60}$ cyclic group may be the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (e.g., the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzisoxazole group, a benzothiazole group, a benzisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the π electron-deficient nitrogen-containing $C_1$-$C_{60}$ cyclic group" as used herein each refer to a group condensed to any cyclic group or a monovalent or polyvalent group (e.g., a divalent group, a trivalent group, a tetravalent group, etc.), depending on the structure of a formula in connection with which the terms are used. In an embodiment, "a benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has 1 to 60 carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle and/or at a terminal end (e.g., the terminus) of the $C_2$-$C_{60}$ alkyl group, and examples thereof may include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at a terminal end (e.g., the terminus) of the $C_2$-$C_{60}$ alkyl group, and examples thereof may include an ethynyl group and a propynyl group.

The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof may include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one double bond in the cyclic structure thereof. Examples of the $C_1$-$C_{10}$ heterocycloalkenyl group may include a 4,5-dihydro-1,2,3,4-oxatriazolylgroup, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, a fluorenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a carbazolyl group, a dibenzofuranyl group, a dibenzothiofuranyl group, and a naphthyridinyl group. When the $C_1$-$C_{60}$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group (e.g., having two or more rings condensed to each other, only carbon atoms (e.g., having 8 to 60 carbon atoms) as ring-forming atoms, and no aromaticity in its entire molecular structure. Examples of the monovalent non-aromatic condensed polycyclic group may include an indenyl group, a fluorenyl group, a spiro-bifluorenyl group, a benzofluorenyl group, an indenophenanthrenyl group, an adamantyl group, and an indeno anthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, at least one heteroatom other than carbon atoms (e.g., having 1 to 60 carbon atoms), as a ring-forming atom, and non-aromaticity in its entire molecular structure. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphtho silolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as a monovalent non-aromatic condensed heteropolycyclic group.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by -$SA_{103}$ (wherein $A_{103}$ is the $C_6$-$C_{60}$ aryl group).

The term "$C_7$-$C_{60}$ aryl alkyl group" as used herein refers to a monovalent group represented by -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" as used herein refers to a monovalent group represented by -$A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as used herein refers to:
- deuterium (-D), —F, —Cl, —Br, —I, a hydroxyl group, a cyano group, or a nitro group;
- a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;
- a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or
- —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ as used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein refers to any atom other than a carbon atom. Examples of the heteroatom may include O, S, N, P, Si, B, Ge, Se, or any combination thereof.

The term "transition metal" as used herein may include hafnium (Hf), tantalum (Ta), tungsten (W), rhenium (Re), osmium (Os), iridium (Ir), platinum (Pt), gold (Au), etc.

The term "Ph" as used herein refers to a phenyl group, the term "Me" as used herein refers to a methyl group, the term "Et" as used herein refers to an ethyl group, the term "ter-Bu," "'Bu" or "Bu'" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

The maximum number of carbon atoms in this substituent definition section is an example only. In an embodiment, the maximum carbon number of 60 in the $C_1$-$C_{60}$ alkyl group is an example, and the definition of the alkyl group is equally applied to a $C_1$-$C_{20}$ alkyl group. Other cases are the same.

* and *' as used herein, unless defined otherwise, each refer to a binding site to a neighboring atom in a corresponding formula or moiety.

Hereinafter, manufacture of a display apparatus according to an embodiment and evaluation results thereof will be described with reference to Examples.

Manufacture of Inkjet Composition

Inkjet Composition (1)

0.1 g of $TiO_2$ (scatterer), 2 g of ZnS (quantum dot), 10 g of cyclohexyl acrylate (monomer: vapor pressure of 0.2 mmHg), and 0.5 g of Coumarin 6 were mixed with 1 ml of PGMEA (solvent), to thereby manufacture Inkjet Composition (1).

Inkjet Composition (2)

Inkjet Composition (2) was manufactured in the same manner as Inkjet Composition (1), except that 1,6-hexanediol diacrylate (monomer: vapor pressure of $0.5 \times 10^{-4}$ mmHg) was utilized as a monomer instead of cyclohexyl acrylate.

Comparison of Efficiency of Concentrated Quantum Dot Layer and General Quantum Dot Layer Example 1

As shown in FIG. 2, Inkjet Composition (1) was sprayed on a pixel and was left in vacuum for one minute to allow volatile monomers to be volatilized, so that inner sides of banks were coated with $TiO_2$ and ZnS, and as a result, a quantum dot layer in which a solid component including $TiO_2$ and ZnS is concentrated was partially formed on a substrate under (e.g., corresponding to) the pixel.

Next, Inkjet Composition (1) was additionally sprayed and left in vacuum for one minute to allow volatile monomers to be volatilized, so that the quantum dot layer in which the solid component including $TiO_2$ and ZnS is concentrated was formed to a greater thickness. Then, the quantum dot layer was cured with UV (350 nm) for one minute, thereby manufacturing a single pixel with a quantum dot layer having an overall thickness of about 5 μm.

Comparative Example 1

Inkjet Composition (2) was utilized instead of Inkjet Composition (1) to form a quantum dot layer, wherein, considering that the volume of sprayed Inkjet Composition (2) did not change due to the low vapor pressure of monomers, Inkjet Composition (2) was utilized in a smaller amount than in Example 1. Then, the quantum dot layer was cured with UV (350 nm) for one minute, thereby manufacturing a single pixel having a thickness of about 5 μm.

The absorption rate of quantum dots and peak wave length (PWL) of the pixels of Example 1 and Comparative Example 1 were compared, and results thereof are shown in Table 1.

TABLE 1

|  | Absorption rate[1] | External quantum efficiency | PWL |
|---|---|---|---|
| Comparative Example 1 | 85.8% | 15.26%[100%] | 530.7 nm |
| Example 1 | 92.9% | 18.29%[119.8%] | 534.1 nm |

1) The absorption rate refers to a ratio at which quantum dots absorb excitation light. 2) External quantum efficiency=(Number of photon emitted/Number of photon excited). When the external quantum efficiency of Comparative Example 1 at 15.26% is set as a reference of 100%, the external quantum efficiency of Example 1 at 18.29% is then 119.8%.

Referring to Table 1, it can be seen that Example 1 is better than (e.g., superior to) Comparative Example 1.

Manufacture of Display Apparatus

As shown in FIG. 4A, a light-emitting device 120 was formed on a first substrate 110 and was covered with a thin-film encapsulation layer 130. An emission layer included in an interlayer of the light-emitting device 120 is a layer that emits blue light, blue and green light, or blue, green, and red light.

Next, as shown in FIG. 4B, on a second substrate 210, a black matrix 250 and color filter layers 220R, 220-1G, 220-2G, and 220B were each formed at a position corresponding to the light-emitting device 120 through a photolithography process.

Next, as shown in FIG. 4C, tops of the color filter layers 220R, 220-1G, 220-2G, and 220B and the black matrix 250 were coated with a bank composition (e.g., composite polymer 240-1), heated, and cured. Then, as shown in FIG. 4D, patterning was performed so that a bank 240 remained at each position between the color filter layers 220R, 220-1G, 220-2G, and 220B between each pixel (e.g., between adjacent pixels).

Afterwards, as shown in FIG. 4E, a quantum dot layer 230-1G was optionally formed in a green main pixel utilizing Inkjet Composition (1) through an inkjet process, and a quantum dot layer 230-2G was optionally formed in a green sub-pixel 230-2G utilizing Inkjet Composition (2) through an inkjet process.

In the case of the quantum dot layer 230-1G of the green main pixel, a concentrated quantum dot layer was formed in the same manner as in Example 1, and, in the case of the quantum dot layer 230-2G of the green sub-pixel, a quantum dot layer was formed in the same manner as in Comparative Example 1.

Quantum dot layers 230R and 230B were optionally formed in a red pixel and a blue pixel through an inkjet process.

Next, as shown in FIG. 4F, a filling material 300 was applied between the first substrate 110 and the second substrate 210, and the two substrates 110 and 210 were bonded together, thereby completing a display apparatus including the light-emitting device 120, the quantum dot layers 230R, 230-1G, 230-2G, and 230B, and the color filter layers 220R, 220-1G, 220-2G, and 220B.

As a result of driving the display apparatus, it was confirmed that efficiency was suitable (e.g., excellent), and there was no decrease in transmittance and a color matching rate in the green pixel.

A display apparatus according to an embodiment includes a main pixel having a high concentration of quantum dots, thereby having high external quantum efficiency, and further includes a sub-pixel having a relatively small amount of scatterers and/or quantum dots, thereby having high (e.g., an increase in) transmittance.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display apparatus comprising:
a first substrate;
a light-emitting device to emit light and on the first substrate;
a main pixel comprising a first quantum dot layer;
a sub-pixel comprising a second quantum dot layer,
the main pixel and the sub-pixel corresponding to the light-emitting device and being located above the first substrate; and
banks around the main pixel to define the main pixel and around the sub-pixel to define the sub-pixel,
wherein the main pixel is to change a color of the light emitted by the light-emitting device, and
the sub-pixel is to transmit the light emitted by the light-emitting device.

2. The display apparatus of claim 1, wherein inner sides of the banks defining the main pixel and/or the sub-pixel are coated with scatterers and quantum dots.

3. The display apparatus of claim 1, wherein
the first quantum dot layer comprises a layer in which after a first inkjet composition, comprising a first liquid component and a first solid component, is sprayed, the first liquid component is evaporated such that the first solid component is concentrated, and
the second quantum dot layer comprises a layer in which after a second inkjet composition, comprising a second liquid component and a second solid component, is sprayed, the second liquid component is not evaporated.

4. The display apparatus of claim 3, wherein the first solid component and the second solid component are the same component.

5. The display apparatus of claim 3, wherein
the first liquid component comprises a first monomer, and
a vapor pressure of the first monomer is 0.1 mmHg or more.

6. The display apparatus of claim 3, wherein
the second liquid component comprises a second monomer, and
a vapor pressure of the second monomer is $10^{-3}$ mmHg or less.

7. The display apparatus of claim 3, wherein
the first solid component comprises a scatterer and a quantum dot, and
the scatterer is from greater than 0 wt % to about 10 wt % in amount, and the quantum dot is from about 5 wt % to about 60 wt % in amount, each based on a total weight of the first inkjet composition.

8. The display apparatus of claim 3, wherein
the second solid component comprises a scatterer and/or a quantum dot, and the second solid component is from about 0.1 wt % to less than 60 wt % in amount based on a total weight of the second inkjet composition.

9. The display apparatus of claim 3, wherein the first inkjet composition and the second inkjet composition each independently further comprises a solvent, a light-emitting organic material, a dispersant, a curing agent, or any combination thereof.

10. The display apparatus of claim 9, wherein the solvent comprises propylene glycol methyl ether acetate (PGMEA), dimethylacetamide (DMA), y-butyrolactone (GBL), cyclohexylamine (CHA), dipropyleneglycol monomethyl ether acetate (DPMA), or any combination thereof.

11. The display apparatus of claim 9, wherein the light-emitting organic material comprises Stilbene 3, Coumarin 120, Coumarin 1, Coumarin 6, Coumarin 47, Coumarin 102, Coumarin 307, Coumarin 153, Rhodamin 6G, Sulforhodamin B, Pyromethene 597, Rhodamin B, Rodamin B/101, Rhodamin 101, DCM, Pyridin 1, Pyridin 2, Styryl 8, Styryl 9, or any combination thereof.

12. The display apparatus of claim 3, wherein the first solid component and the second solid component each independently comprise a scatterer, the scatterer comprising a metal, a metal oxide, a non-metal oxide, or any combination thereof.

13. The display apparatus of claim 12, wherein the scatterer comprises Ag, Al, $SiO_2$, $BaSO_4$, $Al_2O_3$, ZnO, $ZrO_2$, $TiO_2$, or any combination thereof.

14. The display apparatus of claim 3, wherein the first solid component and the second solid component each independently comprise a quantum dot comprising a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

15. The display apparatus of claim 14, wherein
the Group III-VI semiconductor compound comprises: $In_2S_3$, AgInS, $AgInS_2$, CuInS, $CuInS_2$, or any combination thereof,
the Group II-VI semiconductor compound comprises: CdS, CdSe, CdTe, ZnS, ZnSe, ZnTe, ZnO, HgS, HgSe, HgTe, MgSe, MgS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, CdZnSeS, CdZnSeTe, CdZnSTe, CdHgSeS, CdHgSeTe, CdHgSTe, HgZnSeS, HgZnSeTe, HgZnSTe, or any combination thereof,
the Group III-V semiconductor compound comprises: GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, InGaZnP, InAlZnP, or any combination thereof,
the Group III-VI semiconductor compound comprises: GaS, GaSe, $Ga_2Se_3$, GaTe, InS, InSe, $In_2S_3$, $In_2Se_3$, InTe, $InGaS_3$, $InGaSe_3$, or any combination thereof,
the Group I-III-VI semiconductor compound comprises: AgInS, $AgInS_2$, CuInS, $CuInS_2$, $CuGaO_2$, $AgGaO_2$, $AgAlO_2$, or any combination thereof,
the Group IV-VI semiconductor compound comprises: SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, or any combination thereof, and
the Group IV element or compound comprises: Si, Ge, SiC, SiGe, or any combination thereof.

16. The display apparatus of claim 1, wherein the light-emitting device is to emit blue light, green light, red light, or any combination thereof.

17. The display apparatus of claim 1, wherein
the light-emitting device is to emit blue light and green light,
the main pixel is to change the blue light emitted by the light-emitting device into green light, and
the sub-pixel is to transmit the green light emitted by the light-emitting device.

18. The display apparatus of claim 1, wherein the banks do not comprise any scatterer.

19. The display apparatus of claim 1, wherein the main pixel and the sub-pixel each further comprise a color filter layer.

20. The display apparatus of claim 19, wherein the color filter layer is to increase color purity of emitted light.

* * * * *